United States Patent
Tsai et al.

(10) Patent No.: US 10,134,896 B2
(45) Date of Patent: Nov. 20, 2018

(54) CYCLIC DEPOSITION ETCH CHEMICAL VAPOR DEPOSITION EPITAXY TO REDUCE EPI ABNORMALITY

(71) Applicant: Taiwan Semiconductor Manufacturing Co., Ltd., Hsin-Chu (TW)

(72) Inventors: Chun Hsiung Tsai, Xinpu Township (TW); Sheng-Wen Yu, New Taipei (TW); Ying-Min Chou, Tainan (TW); Yi-Fang Pai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/782,112

(22) Filed: Mar. 1, 2013

(65) Prior Publication Data

US 2014/0246710 A1  Sep. 4, 2014

(51) Int. Cl.
*H01L 29/78* (2006.01)
*H01L 21/02* (2006.01)
*H01L 29/66* (2006.01)

(52) U.S. Cl.
CPC ...... *H01L 29/7848* (2013.01); *H01L 21/0262* (2013.01); *H01L 21/02532* (2013.01);
(Continued)

(58) Field of Classification Search
CPC ................ H01L 29/66636; H01L 29/7848
(Continued)

(56) References Cited

U.S. PATENT DOCUMENTS

| 7,456,087 B2 * | 11/2008 | Cheng ........................... 438/584 |
| 2005/0148147 A1 * | 7/2005 | Keating ............ H01L 21/30608 438/299 |

(Continued)

FOREIGN PATENT DOCUMENTS

| KR | 10-2008-0098894 | 11/2008 |
| KR | 2012-0086369 | 8/2012 |
| KR | 10-2013-0135087 | 12/2013 |

OTHER PUBLICATIONS

Official Action dated Apr. 28, 2014 in counterpart KR patent application No. 10-2013-0061910.
(Continued)

*Primary Examiner* — Erik Kielin
(74) *Attorney, Agent, or Firm* — Duane Morris LLP (57) ABSTRACT

A semiconductor substructure with an improved source/drain structure is described. The semiconductor substructure can include an upper surface; a gate structure formed over the substrate; a spacer formed along a sidewall of the gate structure; and a source/drain structure disposed adjacent the gate structure. The source/drain structure is disposed over or on a recess surface of a recess that extends below said upper surface. The source/drain structure includes a first epitaxial layer, having a first composition, over or on the interface surface, and a subsequent epitaxial layer, having a subsequent composition, over or on the first epitaxial layer. A dopant concentration of the subsequent composition is greater than a dopant concentration of the first composition, and a carbon concentration of the first composition ranges from 0 to 1.4 at.-%. Methods of making semiconductor substructures including improved source/drain structures are also described.

14 Claims, 8 Drawing Sheets

(52) U.S. Cl.
CPC .. *H01L 21/02576* (2013.01); *H01L 21/02639* (2013.01); *H01L 29/66636* (2013.01)

(58) Field of Classification Search
USPC ............... 257/E21.431, E21.131, E29.121
See application file for complete search history.

(56) References Cited

U.S. PATENT DOCUMENTS

| | | | |
|---|---|---|---|
| 2007/0190731 A1* | 8/2007 | Chen | H01L 21/26506 438/299 |
| 2007/0254414 A1* | 11/2007 | Miyanami | 438/149 |
| 2008/0026531 A1* | 1/2008 | Beyer et al. | 438/275 |
| 2009/0261349 A1* | 10/2009 | Lee | H01L 29/0847 257/77 |
| 2010/0025779 A1* | 2/2010 | Kammler | H01L 21/26506 257/408 |
| 2010/0065925 A1* | 3/2010 | Huang | H01L 29/42376 257/410 |
| 2011/0057270 A1* | 3/2011 | Nishikawa | 257/408 |
| 2011/0147828 A1* | 6/2011 | Murthy et al. | 257/327 |
| 2012/0058616 A1* | 3/2012 | Ahn | H01L 21/02532 438/285 |
| 2012/0286376 A1* | 11/2012 | Hung | 257/412 |
| 2013/0109144 A1* | 5/2013 | Kim | H01L 21/02532 438/301 |
| 2013/0320429 A1 | 12/2013 | Thomas | |
| 2013/0328126 A1* | 12/2013 | Tsai | H01L 29/41783 257/368 |

OTHER PUBLICATIONS

Official Action dated Aug. 1, 2015, in counterpart KR patent application No. 10-2013-0061910.

* cited by examiner

CYCLIC DEPOSITION ETCH CHEMICAL VAPOR DEPOSITION EPITAXY TO REDUCE EPI ABNORMALITY

TECHNICAL FIELD

The disclosure relates to NMOS source/drain structures formed with reduced defects and methods of making the same.

BACKGROUND

N-type metal oxide semiconductor transistor (NMOS) devices are utilized throughout the electronics industry. Source/drain regions of transistors are generally formed in a recess in the substrate adjacent to the transistor gate. The source-drain structures can be formed of a strain inducing material in order to introduce strain in the channel region of the transistor. PMOS performance is enhanced by applying compressive strain to the channel, whereas NMOS performance is improved by tensile strain. The increased strain is known to improve device performance and device speed.

High dopant concentrations are advantageously utilized in the source/drain structure in order to induce strain and improve device performance. When source/drain structures are formed using epitaxial deposition methods, it is difficult to achieve the high dopant concentration levels necessary to provide the increased device speed in a stable, reliable and defect-free material. This shortcoming can be attributed to the defects that are created when epitaxial deposition processes are used to produce source/drain structures with high dopant concentrations directly on crystalline silicon substrates. This significantly limits the potential dopant concentration in the source/drain structure.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for forming improved NMOS devices, such as metal-oxide-semiconductor field-effect transistors (MOSFETs). The disclosure provides systems with reduced defects in the source/drain structure by producing an improved interface layer between the substrate and the strain material. An overview of the method used to form various NMOS devices according to the disclosure is provided in FIGS. 1 & 2. Further details of the method and structures formed according to the methods are provided in conjunction with the subsequent figures.

Figure 1:
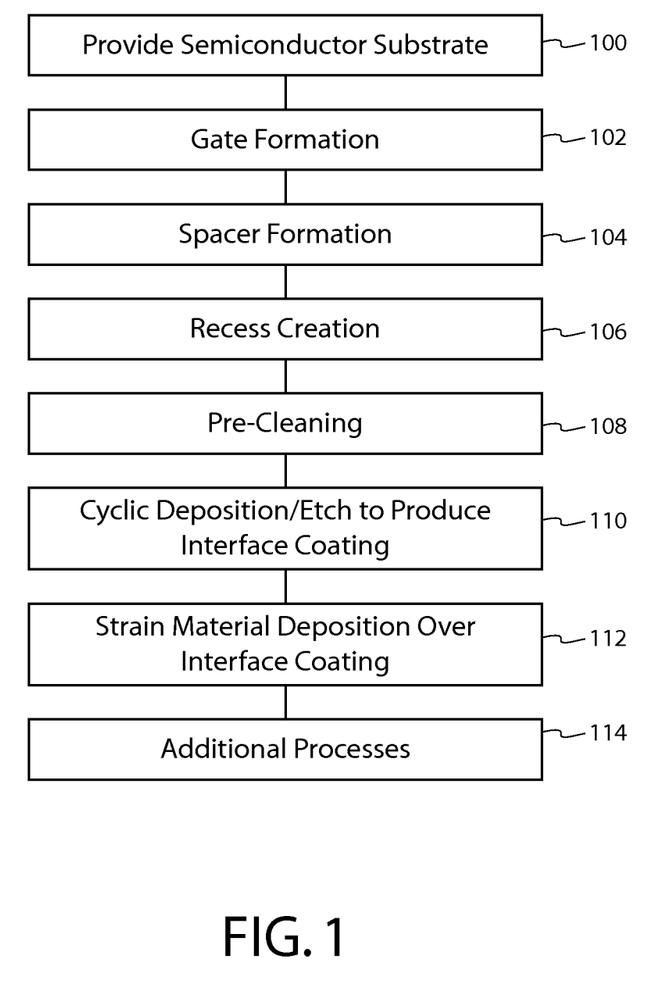
FIG. 1 is a flowchart for forming a substructure having a source/drain structure in accordance with some embodiments.

In accordance with some embodiments, FIG. 1 is a flowchart describing a broad method for carrying out the formation of a semiconductor substructure (e.g., a NMOS transistor) embodiment. At step 100, a semiconductor substrate is provided. The semiconductor substrate can be silicon, such as crystalline silicon, silicon on insulator (SOI), or another suitable semiconductor material. Step 102 provides for the formation of a gate structure. Step 104 provides for the formation of spacers along sidewalls of the gate structure. Step 106 provides for etching of the semiconductor material to form recesses adjacent to the gate structure that extends under at least a portion of the spacer. Step 108 provides for a pre-cleaning process to remove a native oxide layer and any contaminants from the surface of the recesses. Step 110 provides for a cyclic deposition/etch process for forming an interface coating on the recess surface that serves as the foundation of the source-drain structure. Step 112 provides for in-situ filling of the recesses by depositing strain inducing material over and/or on the interface layer to form the source-drain structure. Step 114 provides for additional steps for completing the formation of the semiconductor substructures. Examples of additional steps can include, but are not limited to, deposition of a contact etch step layer (CESL) layer, deposition of a dielectric layer, additional etching and polishing steps, and/or deposition of additional circuitry.

Figure 2:
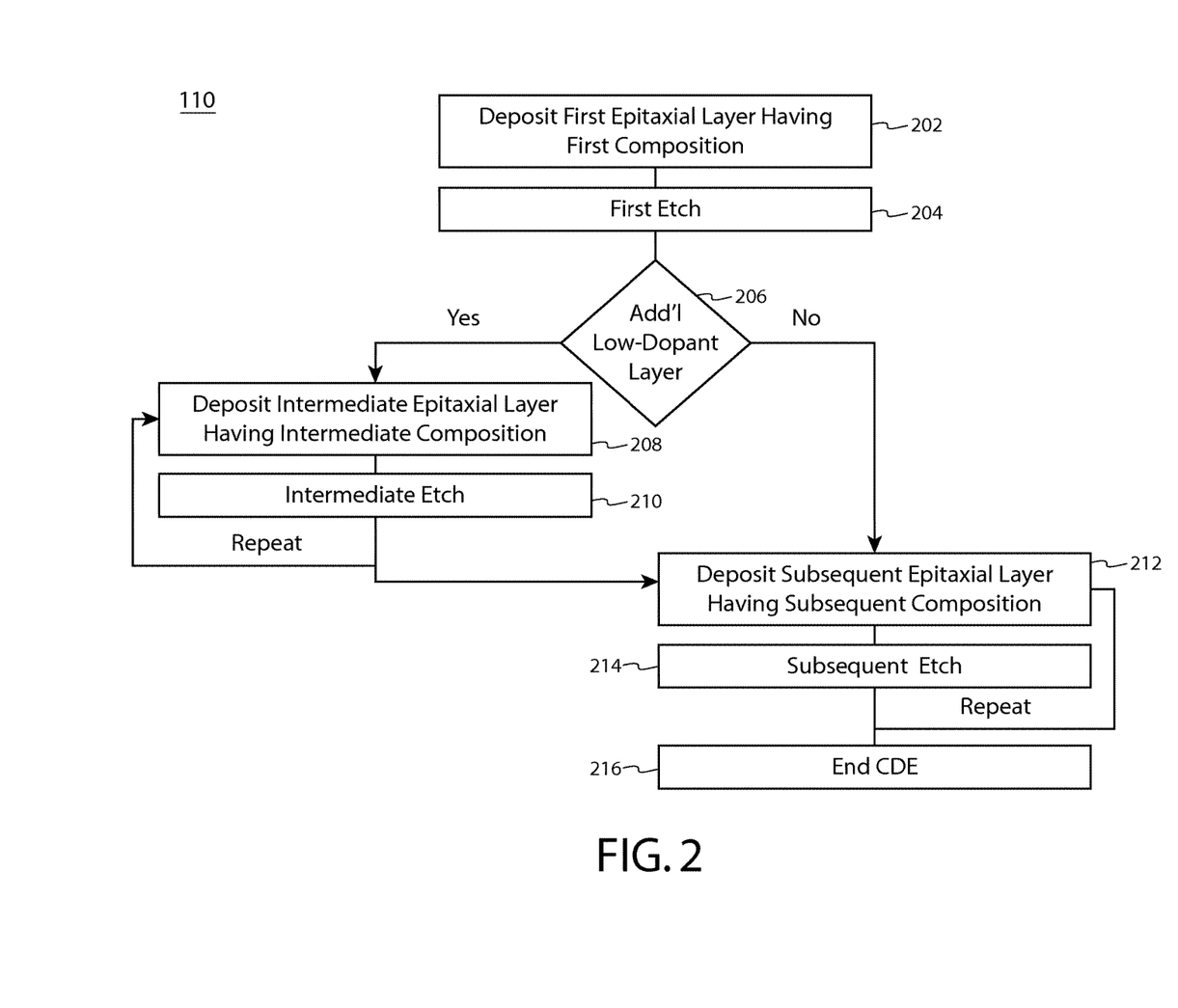
FIG. 2 is a flow chart for a cyclic deposition/etch process for forming an asymmetric, epitaxial interface coating in accordance with some embodiments.

FIG. 2 is a flowchart describing a broad method for depositing the interface coating in step 110 of FIG. 1. Step 202 provides for depositing a first epitaxial layer having a first composition. Step 204 provides a first etch to remove a portion of the material deposited during step 202. As detailed below, the dopant concentration of the first composition is minimal to reduce lattice mismatch in the initial monolayers deposited on the recess surface. Step 206 provides a decision whether to deposit one or more intermediate epitaxial layers having intermediate compositions, which also have low dopant concentrations. If intermediate low-dopant epitaxial layers are desired, step 208 provides for depositing an intermediate epitaxial layer having an intermediate composition, while step 210 provides an intermediate etch to remove a portion of the material deposited during step 208.

After the final low-dopant, epitaxial layer is deposited, step 212 provides for depositing subsequent epitaxial layers having subsequent compositions, which have higher dopant concentrations. Step 214 provides a subsequent etch to remove a portion of the material deposited during step 212. In some embodiments, steps 212 and 214 are repeated 6-14 times in order to deposit an interface coating having a thickness of approximately 200 Å. The composition of the subsequent layers deposited in steps 212 and 214 can be substantially the same. Step 216 provides for the end of the cyclic deposition/etch (CDE) process once the interface coating reaches the desired thickness. The deposition steps 202, 208, 212 can be non-selective, while the etch steps 204, 210, 214 can be selective. Additional details of this process will be evident from the following discussion of FIG. 3-10.

Figure 3:
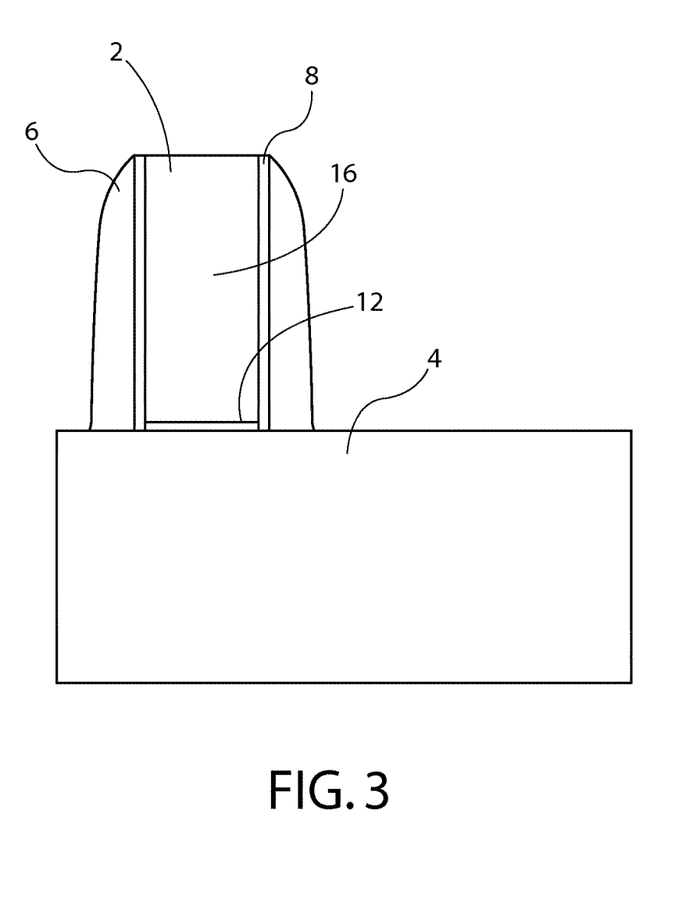
FIG. 3 is a cross-sectional view showing an intermediate structure following formation of a gate structure and spacers in accordance with some embodiments.

FIG. 3 is a cross-sectional view of an intermediate step in the formation of an exemplary NMOS transistor after a gate structure 2 has been formed over the substrate 4 and a spacer 6 is formed along a sidewall of the gate structure 2. The substrate 4 is silicon (e.g., single crystal silicon, polycrystalline silicon or amorphous silicon) in some embodiments, and the substrate 4 is formed of other suitable materials in other embodiments. The spacer 6 can be a nitride (e.g., silicon nitride, silicon carbon nitride) in some embodiments or any other suitable material in other embodiments.

In some embodiments, such as that shown in FIG. 3, a seal layer 8 can be disposed between the gate structure 2 and the spacer 6, and the spacer 6 can be formed on the seal layer 8. In other embodiments, the seal layer 8 can be formed directly on a sidewall of the gate structure 2. The seal layer 8 can be an oxide (e.g., silicon dioxide) in one embodiment or any other suitable material in other embodiments.

The gate structure 2 can include a gate electrode 10 and a gate insulation layer (e.g., oxide) 12, which can be present between the gate electrode 10 and the substrate 4. The gate insulation layer 12 can be deposited on or over the substrate 4 or can be a native oxide (e.g., silicon dioxide) that has formed on the substrate 4. Native oxide layers are typically <10 Å (1 nm) in thickness. The gate electrode 10 can be polycrystalline silicon in some embodiments, and can be formed of other suitable materials in other embodiments. The gate electrode 10 can be doped in some embodiments and undoped in other embodiments. The gate insulation layer 12 can be silicon dioxide in some embodiments or can be formed of other suitable materials (e.g., high-K materials) in other embodiments.

Figure 4:
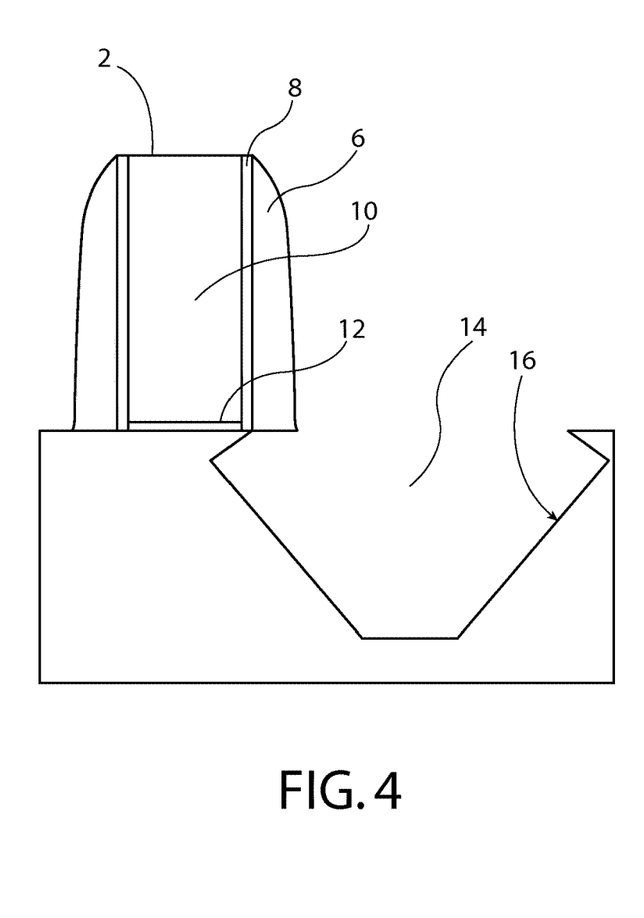
FIG. 4 is a cross-sectional view of an intermediate structure following recess formation in accordance with some embodiments.

FIG. 4 is a cross-sectional view of an intermediate step in the formation of an exemplary NMOS transistor embodiment after recess creation 106. The recess 14 is formed adjacent to the gate structure 2. The recess 14 is formed in the substrate 4 and can extend under at least a portion of the spacer 6.

The process for forming the recess 14 can be isotropic or anisotropic. The recess 14 can be formed using wet or dry etching or other suitable techniques. The technique used to create the recess 14 can selectively remove the substrate 4 relative to the spacer layer 6, the seal layer 8, or both. If the technique is an etching technique, the etchant can be tetramethylammonium hydroxide (TMAH) or other suitable etchants. TMAH can be used to create anisotropic recesses in silicon substrates. For example, TMAH could be used to form the shaped recess 14 shown in FIG. 4. Although FIG. 4 shows an embodiment where the recess 14 is diamond shaped for ease of illustration, corners of the recess 14 could be rounded by other ordinary etch processes.

Following recess creation, the recess surface 16 can be prepared for deposition of an interface coating 30 (e.g., an asymmetric, epitaxial interface coating) during a pre-cleaning process 108, which removes any native oxides or other contaminants from the recess surface 16. The pre-cleaning step 108 can selectively remove native oxides, or other contaminants, relative to the substrate 4, the spacer 16, or both. Pre-cleaning techniques include, but are not limited to, in situ dry chemical cleaning, such as Siconi™ pre-cleaning processes offered by Applied Materials, Inc., and dilute hydrofluoric acid pre-cleaning processes.

After the recess surface 18 has been pre-cleaned, the interface coating 30 is formed using the cyclic deposition/etch (CDE) step 110. The CDE process enables high-quality, selective, epitaxial deposition of materials. Each cycle of the CDE process includes a non-selective deposition of a material over an existing structure and then selectively etching undesired deposits of the material so that the material is deposited selective after each cycle is completed.

Figure 5:
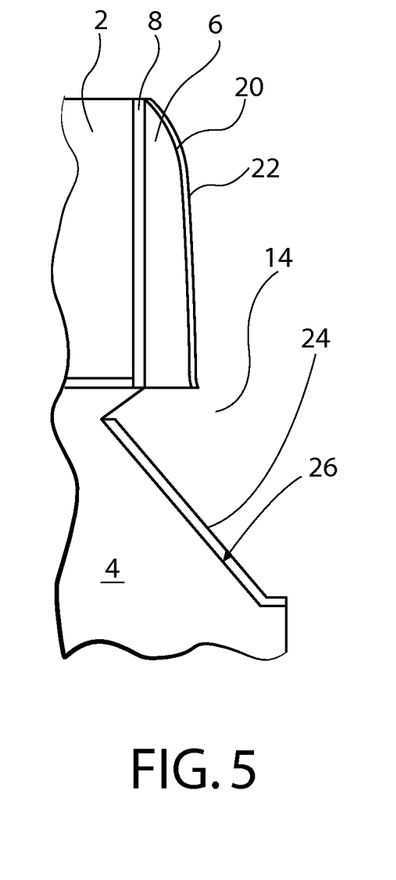
FIG. 5 is a cross-sectional view of the intermediate structure of FIG. 4 following non-selective deposition of a first layer over the intermediate structure.
Figure 6:
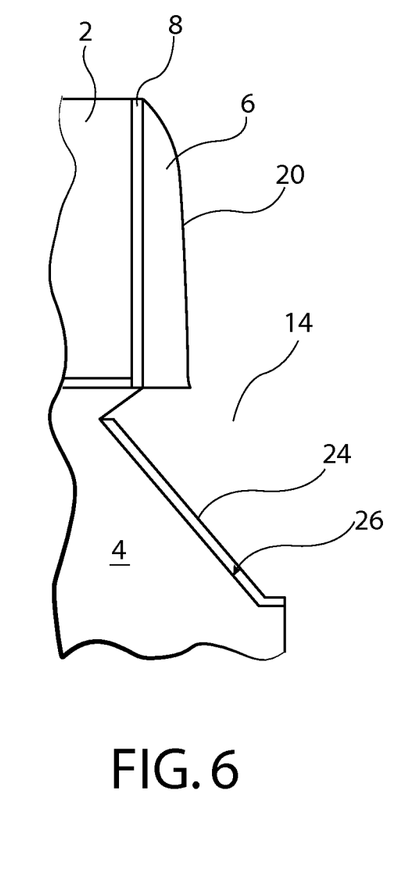
FIG. 6 is a cross-sectional view of the intermediate structure of FIG. 5 following selective etching of the first layer.

In one embodiment, such as that shown in FIGS. 5 & 6, a relevant portion of the existing structure is a recess surface 16 and a spacer 6 with a contact etch stop layer (CESL) 20. The CESL 20 can be a separate layer applied on the spacer 6, or the CESL 20 can be the outer surface of the spacer 6. The CESL 20 can be formed of silicon nitride, silicon oxynitride, silicon carbide, silicon oxycarbide, combinations thereof, or other suitable materials. In some embodiments, the CESL 20 is formed of silicon nitride. The CESL 20 can be formed by using chemical vapor deposition (CVD), high density plasma CVD, sputtering, or other suitable method.

FIG. 5 shows a structure formed by following the initial deposition of a material 22, 24. This is equivalent to one of the deposit steps 202, 208, 212 from the CDE process shown in FIG. 2. The material 22, 24 can have a silicon-based material, such as phosphorous and carbon doped Si, a phosphorous doped Si or other suitable materials. When the material 22, 24 is silicon-based, the material 22 deposited on the CESL layer 20 will be amorphous because the crystal structures of the CESL and the material 22 do not match. In contrast, the material 24 deposited on crystalline silicon of the recess surface 16 can be epitaxial and crystalline when suitable silicon-based materials are deposited. As a result, an etchant can be used to selectively remove the amorphous material 22 without removing the crystalline material 24. The etchant used to remove the amorphous material can be hydrofluoric acid or other suitable etchants.

FIG. 6 shows the structure of FIG. 5 following a selective etch to remove the amorphous silicon 22 from the spacer 6. This step is equivalent to one of the etch steps 204, 210, 214 from the CDE process shown in FIG. 2. As show in FIG. 6, following the selective etch, only the epitaxial layer 24 will remain.

Strained layers or materials are used in semiconductor substructures because the biaxial tensile or compressive strain produced by the strain material disturbs the lattice structure in the channel region, so as to alter carrier mobility in the layers, enabling the fabrication of high-speed devices, low-power devices or both. Conventionally, the interface coating applied to the recess surface as the foundation for the strain structures is produced using a CDE process where each cycle is identical. For NMOS strain materials, the composition used in the CDE process is silicon-based with carbon doping of approximately 1.5 atomic-% (at.-%) and phosphorous doping of approximately 2 to $7\times10^{20}$ atom/$cm^3$. However, this strategy results in a significant number of defects, which may prevent the resulting NMOS transistor from functioning properly. The NMOS structures described herein exhibit fewer defects than those made by conventional CDE processes. In particular, the structures described herein vary the composition of the interface coating so that the first layer or two deposited on the recess surface have little to no dopant, while the remaining layers have higher doping levels adapted for inducing strain in the gate structure. The resulting structure is much less likely to produce source/drain structures with defects. While not wishing to be bound by theory, it is believed that depositing one or two low dopant epitaxial layers directly on the recess surface creates a foundation with minimal lattice mismatches and strain. This produces a gradual dopant transition from the crystalline substrate to the highly doped source/drain structure, which results in fewer defects that propagate in subsequent layers.

Figure 7:
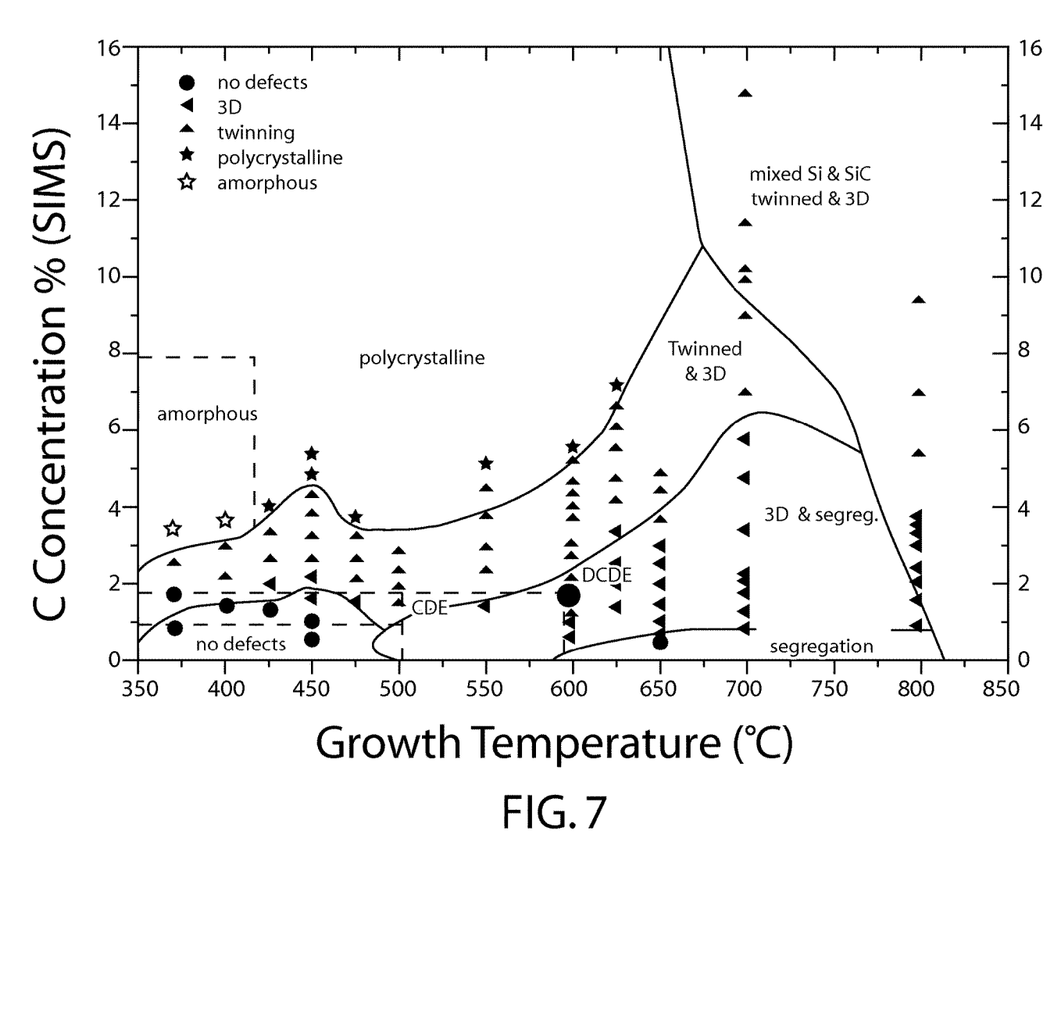
FIG. 7 is a chart showing the occurrence and types of defects present in source/drain structures as a function of the conditions used to produce the interface coating by a CDE process.

FIG. 7 is a chart showing the occurrence and types of defects present in source/drain structures as a function of the conditions used to produce the interface coating by a CDE process. The x-axis is deposition temperature, while the y-axis is the carbon doping concentration in the interface coating. As can be seen, defects are more likely at temperatures over 600° C. and carbon doping concentrations above approximately 1.5 at.-%. It is also observed that more serious defects (e.g., amorphous or polycrystalline deposits) occur as temperature and/or carbon doping concentration increase. This data is based on interface coatings deposited using a CDE process where all layers had the same composition, instead of graded dopant process.

Figure 8:
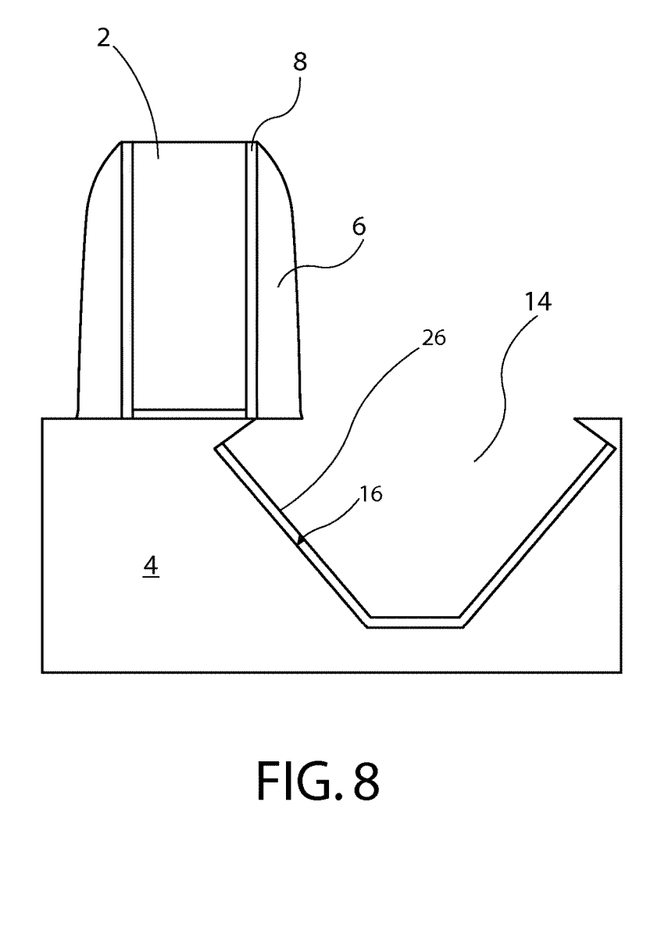
FIG. 8 is a cross-sectional view of the intermediate structure following deposition of the first epitaxial layer of the interface coating in accordance with some embodiments.

FIG. 8 is a cross-section view of an intermediate step in the formation of an NMOS transistor embodiment after the first deposit and etch steps 202, 204. The first epitaxial layer 26 is deposited on the recess surface 16 as a result of the first cycle of the CDE process (i.e., steps 202, 204).

Figure 9:
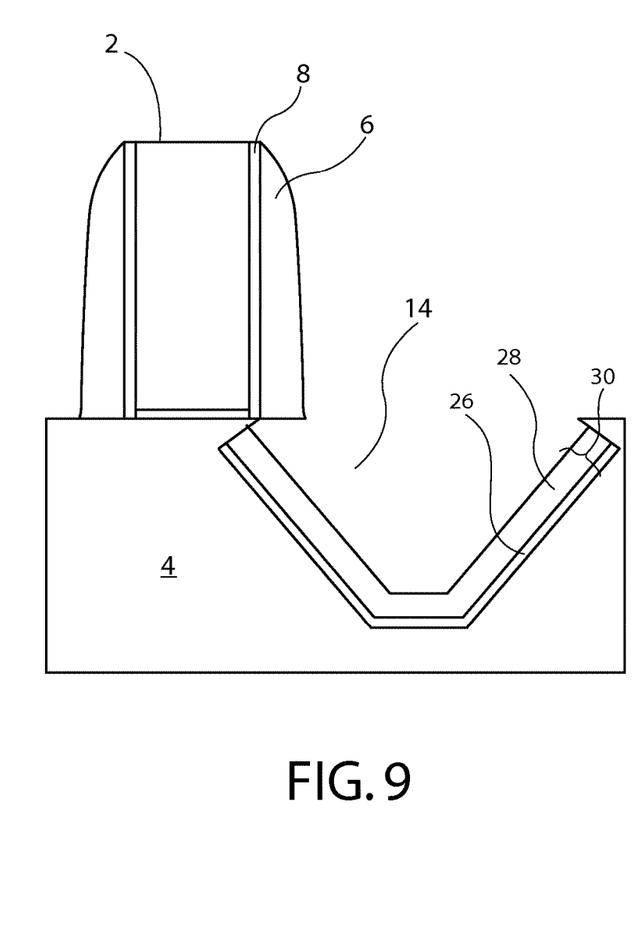
FIG. 9 is a cross-sectional view of the structure of FIG. 8 after deposition of the interface coating has been completed in accordance with some embodiments.

FIG. 9 is a cross-section view of the structure of FIG. 8 after completing the CDE process 110 of FIGS. 1 & 2 with only one low-dopant layer 26 (i.e., "no" at step 206). The subsequent epitaxial layers 28 are deposited over the first epitaxial layer 26 to form the complete epitaxial interface coating 30. In some embodiments, steps 212, 214 of FIG. 2 can be repeated to deposit the subsequent epitaxial layers 28 and produce an epitaxial interface coating 30 having a desired thickness. The interface coating 30 can be at least 100-250 Å thick, and steps 212 & 214 can be repeated 6-14 times. The interface coating 30 can be an asymmetric with respect to composition.

Figure 10:
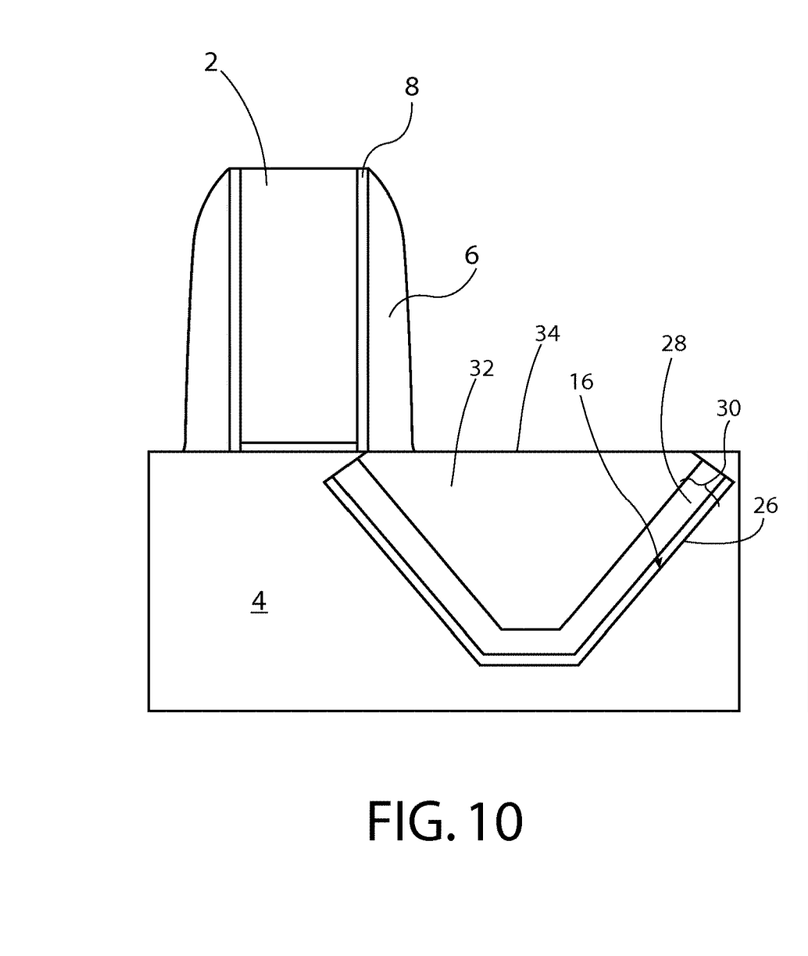
FIG. 10 is a cross-sectional view of the structure of FIG. 9 after deposition of the source/drain structure in accordance with some embodiments.

FIG. 10 is a cross-section view of the structure of FIG. 9 after completing the strain material deposition process 112 of FIG. 1. The bulk strain material 32 is deposited to complete the source/drain structure 34. The bulk strain material 32 can be deposited using a selective epitaxial growth (SEG) technique and can have a bulk composition. Examples of SEG techniques include, but are not limited to, plasma enhanced chemical vapor deposition (PECVD), ultrahigh vacuum CVD (UHV-CVD), ultrahigh vacuum rapid thermal-CVD (UHV-RTCVD), and other suitable processes.

Figure 11:
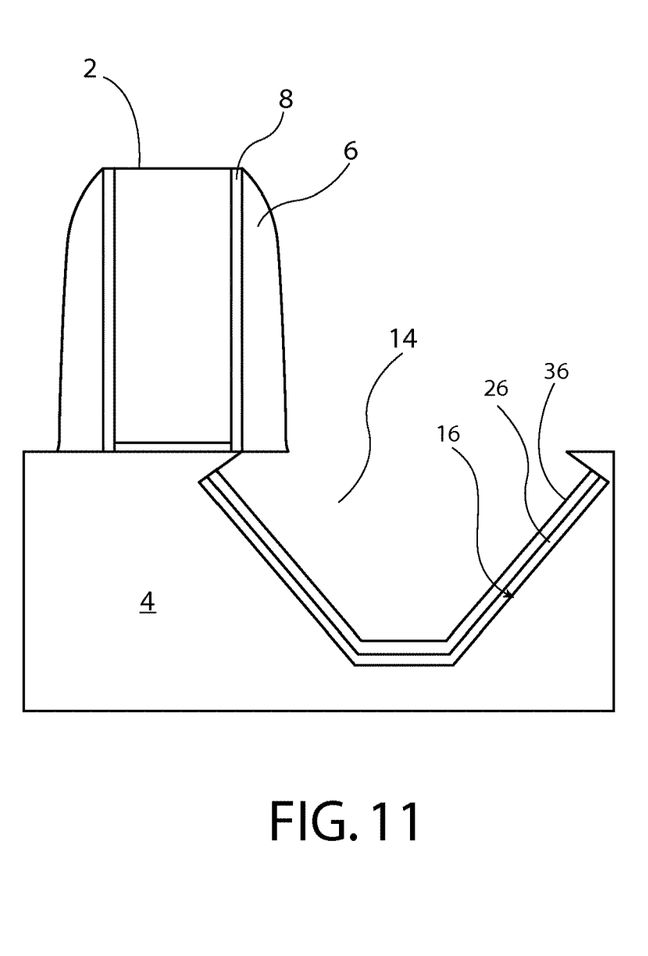
FIG. 11 is a cross-sectional view of the structure of FIG. 8 after deposition of a second epitaxial layer of the interface coating in accordance with some embodiments.

FIG. 11 is a cross-section view of the structure of FIG. 8 after a second epitaxial layer 36 (i.e., the first intermediate epitaxial layer) having a second composition is deposited on the first epitaxial layer 26. The second epitaxial layer 36 is deposited on the first epitaxial layer 26 as a result of the second cycle of the CDE process (i.e., steps 208, 210). Additional, low-dopant layers can be deposited as appropriate.

As will be understood from FIG. 2, additional intermediate layers 36 can be deposited prior to depositing the subsequent epitaxial layers 28 to form a graded, carbon composition. Each intermediate epitaxial layer $36_n$ can have a dopant concentration equal to or greater than the previous intermediate epitaxial layer $36_{n-1}$ and each intermediate layer $36_n$ can have a dopant concentration that is less than a dopant concentration of the subsequent epitaxial layer 28. For instance, the carbon concentration of the low-dopant layer 26 can be 0 at-%, the first intermediate epitaxial layer $36_1$ can have a carbon concentration of 0.2 at-% and subsequent intermediate epitaxial layers $36_2$, $36_3$, $36_4$, $36_5$, $36_6$ can have carbon concentrations of 0.4 at-%, 0.6 at-%, 0.8 at-%, 1.0 at-% and 1.2 at-%, respectively. In another example, the carbon concentration of the first epitaxial layer 26 can be 0 at-% and intermediate epitaxial layers ($36_1$, $36_2$, $36_3$, $36_4$, $36_5$, $36_6$, $36_7$) can have increasing carbon concentrations (0 at-%, 0 at-%, 0.5 at-%, 0.5 at-%, 1 at-%, 1 at-%, 1.4 at-%, respectively).

Figure 12:
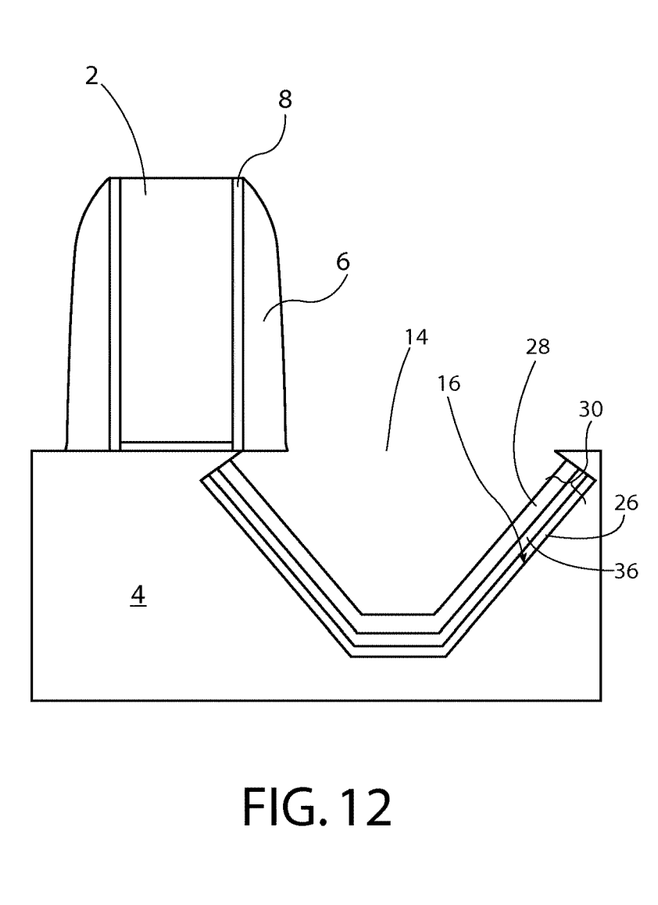
FIG. 12 is a cross-sectional view of the structure of FIG. 11 after deposition of the interface coating has been completed in accordance with some embodiments.

FIG. 12 is a cross-section view of the structure of FIG. 11 after completion of the CDE process 110 of FIGS. 1 & 2 with two low-dopant layers (i.e., "yes" at step 206). The subsequent epitaxial layers 28 are deposited over the first and intermediate (e.g., second) epitaxial layers 26, 36 to form the complete epitaxial interface coating 30. In some embodiments, steps 212, 214 of FIG. 2 can be used repeated to deposit the subsequent epitaxial layers 28 and produce an epitaxial interface coating 30. The interface coating 30 can be at least 100-250 Å thick, and steps 212 & 214 can be repeated 6-14 times. The interface coating 30 can be asymmetric with respect to composition.

Figure 13:
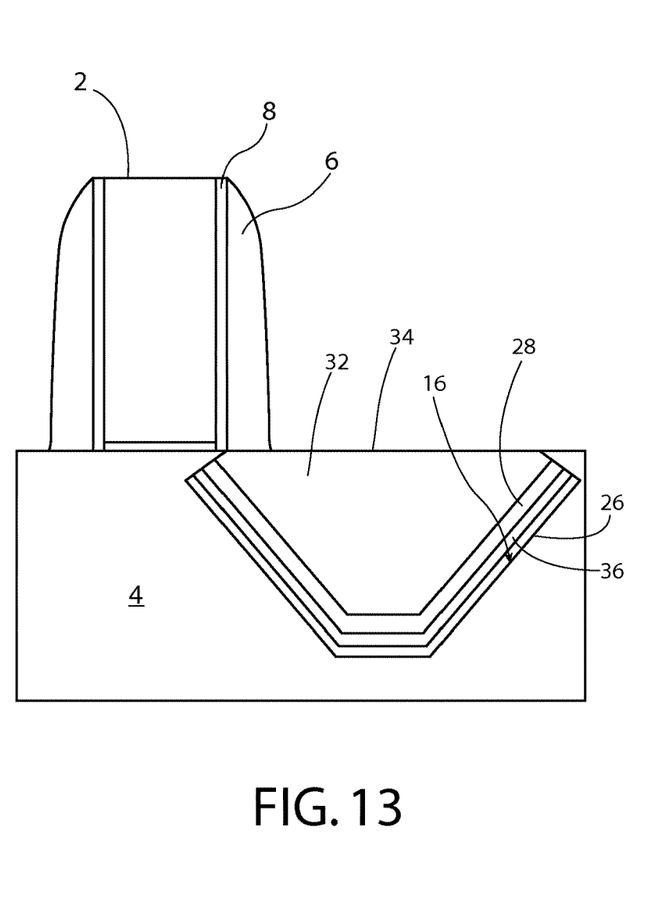
FIG. 13 is a cross-sectional view of the structure of FIG. 12 after deposition of the source/drain structure in accordance with some embodiments.

FIG. 13 is a cross-section view of the structure of FIG. 12 after completing the strain material deposition process 112 of FIG. 1. The bulk strain material 32 is deposited to complete the source/drain structure 34. The bulk strain material 32 can be deposited using a selective epitaxial growth (SEG) technique and can have a bulk composition.

The following are general descriptions and, unless otherwise stated, apply equally to interface coatings 30 that include one, two or more low-dopant layers 26 and/or 36. The phrases "low-dopant layer" and "low-dopant layers" are intended to include the first epitaxial layer 26 and, when present, the intermediate epitaxial layer(s) 36 and other low-dopant layers deposited as part of the interface coating 30. Unless otherwise specified, even when "low-dopant layer(s)" is used to refer to both the first and intermediate epitaxial layers 26, 36, features of the first epitaxial layer 26 and the intermediate epitaxial layer 36 and other low-dopant layers deposited as part of the interface coating 30 can vary independently of one another.

In some embodiments, the bulk composition can be the same as the subsequent composition. In some embodiments, regardless of the number of low-dopant layers 26 and/or 36, the bulk composition can have a dopant concentration greater than one or more of the first composition, the second composition, and the subsequent composition.

The first epitaxial layer 26 can have a first composition. The intermediate epitaxial layer(s) 36 can have a intermediate composition(s). The subsequent layer(s) 30 can have a subsequent composition. The low-dopant layers 26 and/or 36, the subsequent epitaxial layer(s) 28 and/or the bulk strain material 32 can be SiCP or another suitable NMOS strain material. The dopant concentration (e.g., carbon, phosphorous, or both) of the subsequent composition can be greater than the dopant concentration of the low-dopant layers.

In some embodiments, a total dopant concentration of the subsequent composition can be at least 0.1 at-% greater than a total dopant concentration of the low-dopant layers 26 and/or 36. In other embodiments, the total dopant concentration of the subsequent composition can be greater than a total dopant concentration of the low-dopant layers 26 and/or 36 by at least 0.2 at-%, or at least 0.3 at-%, or even at least 0.4 at-%.

In some embodiments, a concentration of an individual dopant in the subsequent layer 28 can be at least 0.1 at-% greater than a concentration of the individual dopant in the low-dopant layers 26 and/or 36. In other embodiments, a concentration of an individual dopant in the subsequent layer 28 can be greater than the concentration of the individual dopant in the low-dopant layers 26 and/or 36 by at least 0.2 at-%, or at least 0.3 at-%, or even at least 0.4 at-%.

A carbon concentration of the first composition, the second composition or both, can range from 0 to 1.4 at-%. In some embodiments, the carbon concentration of the low-dopant layer(s) can be at least 0.01 at-%, or at least 0.05 at-%, or at least 0.1 at-%, or at least 0.3 at-%. In some embodiments, the carbon concentration of the low-dopant layer(s) can be 1.2 at-% or less, 1.0 at-% or less, or 0.9 at-% or less. The carbon concentration could range from 0.01 to 2.5 at-%. In some embodiments, the carbon and/or phosphorous doping levels of the low-dopant layer(s) can be graded.

In some embodiments, the carbon concentration of the subsequent composition, the bulk composition, or both, can be at least 1.5 at-%. In some embodiments, the carbon concentration of the subsequent composition, the bulk composition, or both, can be at least 1.6 at-%, at least 1.7 at-%, or even at least 2.0 at-%. The phosphorous concentrations ranges from 2 to $7 \times 10^{20}$ atom/cm$^3$. In some embodiments, the carbon and/or phosphorous doping levels of the subsequent composition, the bulk composition, or both, can be graded.

In some embodiments, the low-dopant layers 26 and/or 36 consist essentially of silicon or phosphorous doped silicon. In some embodiments, the low-dopant layer(s) can be free of carbon doping. In some embodiments, the carbon and/or phosphorous concentration of the low-dopant layer(s) can be less than the carbon and/or phosphorous concentration of the subsequent concentration.

In some embodiments, the thickness of each of the low-dopant layer(s) can be 15 Å or less. In some embodiments, the thickness of the low-dopant layer(s) can be 12 Å or less, and can be 10 Å or less in other embodiments. The thickness of the low-dopant layer(s) can be at least 3 Å, at least 5 Å, or at least 7 Å.

In some embodiments, the temperature during deposition of the low-dopant layer(s) can be 600° C. or less. In some embodiments, the temperature during deposition of the low-dopant layer(s) can be 550° C. or less, or 525° C. or less, or even 500° C. or less.

In some embodiments, the pressure during deposition of the low-dopant layer(s) can be 120 torr or less. In some embodiments, the pressure during deposition of the low-dopant layer(s) can be 110 torr or less, or 100 torr or less, or even 90 torr or less.

Isothermal, Isobaric Cyclic Deposition/Etch

One or more cycles of the CDE process can be isothermal, isobaric or both. Each cycle of the CDE process can be isothermal, isobaric or both. In one embodiment of an isothermal, isobaric CDE process, the low-dopant layer or layers can be deposited using the following conditions:

|  | Purge | Deposit | Purge | Etch |
| --- | --- | --- | --- | --- |
| Pressure (Torr) | 90 | 90 | 90 | 90 |
| Temp (° C.) | 510 | 510 | 510 | 510 |
| Monomethylsilane (sccm) | 0 | 0 | 0 | 0 |
| PH$_3$ 65 at.-% (sccm) | 0 | 100 | 0 | 0 |
| Trisilane (sccm) | 0 | 190 | 0 | 0 |
| HCl (sccm) | 500 | 0 | 500 | 500 |
| GeH4 (sccm) | 0 | 0 | 0 | 154 |

For each CDE cycle, the depositing conditions can be maintained until a low-dopant layer approximately 8 Å-20 Å thick is deposited. In some embodiments, each low-dopant layer deposited can be approximately 10 Å thick.

In the table, monomethylsilane (H$_3$SiCH$_3$) is used as a carbon source for carbon doping, phosphane (PH$_3$) is used as a phosphorous source for phosphorous doping, and trisilane (Si$_3$H$_8$) is used for the silicon phase. The flow rate of these gaseous compounds is provided in standard cubic centimeters.

As will be understood, these flow rates are relative to the size of the chamber and the surface area of the substrate being treated. In one embodiment, the volume % of PH$_3$ is approximately 34.4% (i.e., 100:290). The volume % of PH$_3$ could range from 9.5% to 44.1% based the selection of gas flow rate In some embodiments, the low-dopant layers 26, 36 can be free of carbon doping.

The CDE conditions for deposition of the subsequent layers can be as follows:

|  | Purge | Deposit | Purge | Etch |
| --- | --- | --- | --- | --- |
| Pressure (Torr) | 90 | 90 | 90 | 90 |
| Temp (° C.) | 510 | 510 | 510 | 510 |
| Monomethylsilane (sccm) | 0 | 120 | 0 | 0 |
| PH$_3$ 65 at.-% (sccm) | 0 | 245 | 0 | 0 |
| Trisilane (sccm) | 0 | 190 | 0 | 0 |
| HCl (sccm) | 500 | 0 | 500 | 500 |
| GeH4 (sccm) | 0 | 0 | 0 | 154 |

For each CDE cycle, the depositing conditions can be maintained until a subsequent layer approximately 8 Å-20 Å thick is deposited. In some embodiments, each subsequent layer deposited can be approximately 10 Å thick and can have a carbon doping level of approximately 1.6 at.-%. In some embodiments, the volume % of H$_3$SiCH$_3$ is approximately 21.6% (i.e., 120:555). The volume % of H$_3$SiCH$_3$ could range from 10.3% to 31.5% based the selection of gas flow rate.

Dynamic Cyclic Deposition/Etch

One or more cycles of the CDE process can be dynamic with respect to temperature, pressure, or both. Each cycle of the CDE process can be dynamic with respect to temperature, pressure, or both. In one embodiment of a dynamic CDE process, the low-dopant layer or layers can be deposited using the following conditions:

|  | Deposit | T, P$_{ramp}$ | Etch |
| --- | --- | --- | --- |
| Pressure (Torr) | 10 | 10 → 350 | 350 |
| Temp (° C.) | 590 | 590 → 660 | 660 |
| Monomethylsilane (sccm) | 0 | 0 | 0 |
| PH$_3$ 65 at.-% (sccm) | 15 | 0 | 0 |
| Disilane (sccm) | 58 | 0 | 0 |

-continued

|  | Deposit | T, $P_{ramp}$ | Etch |
|---|---|---|---|
| Silane (sccm) | 214 | 0 | 0 |
| HCl (slm) | 0 | 18 | 18 |
| GeH$_4$ (sccm) | 60 | 0 | 0 |

For each CDE cycle, the depositing conditions can be maintained until a low-dopant layer approximately 8 Å-20 Å thick is deposited. In some embodiments, each low-dopant layer deposited can be approximately 10 Å thick In the table, all abbreviations and terms have the same meaning as in the isothermal, isobaric CDE process described above. In addition, disilane (Si$_2$H$_6$) and silane (SiH$_4$) are used for the silicon phase and the HCl flow rate is in standard liters per minute. As will be understood, these flow rates are relative to the size of the chamber and the surface area of the substrate being treated. In one embodiment, the volume of PH$_3$ is approximately 5.2% (i.e., 15:287). The volume % of PH$_3$ could range from 3.5% to 15.5% based the selection of gas flow rate. In some embodiments, the low-dopant layers 26, 36 can be free of carbon doping.

The CDE conditions for deposition of the subsequent layers can be as follows:

|  | Deposit | T, $P_{ramp}$ | Etch |
|---|---|---|---|
| Pressure (Torr) | 10 | 10 → 350 | 350 |
| Temp (° C.) | 590 | 590 → 660 | 660 |
| Monomethylsilane (sccm) | 400 | 0 | 0 |
| PH$_3$ 65 at.-% (sccm) | 31 | 0 | 0 |
| Disilane (sccm) | 58 | 0 | 0 |
| Silane (sccm) | 214 | 0 | 0 |
| HCl (slm) | 0 | 18 | 18 |
| GeH$_4$ (sccm) | 60 | 0 | 0 |

For each CDE cycle, the depositing conditions can be maintained until a subsequent layer approximately 8 Å-20 Å thick is deposited. In some embodiments, each subsequent layer deposited can be approximately 10 Å thick and can have a carbon doping level of approximately 1.6 at.-%. In some embodiments, the volume of H$_3$SiCH$_3$ is approximately 56.9% (i.e., 400:703). The volume % of H$_3$SiCH$_3$ could range from 24.8% to 62.3% based the selection of gas flow rate.

In some embodiments, a semiconductor substructure is provided. The semiconductor substructure can include an upper surface; a gate structure formed over the substrate; a spacer formed along a sidewall of the gate structure; and a source/drain structure disposed adjacent the gate structure. The source/drain structure is disposed over or on a recess surface of a recess that extends below said upper surface. The source/drain structure includes a first epitaxial layer, having a first composition, over or on the interface surface, and a subsequent epitaxial layer, having a subsequent composition, over or on the first epitaxial layer. A dopant concentration of the subsequent composition is greater than a dopant concentration of the first composition, and a carbon concentration of the first composition ranges from 0 to 1.4 at.-%.

In some embodiments, a method of forming a semiconductor substructure is provided. The method can include: providing a silicon semiconductor substrate; forming a gate structure with a spacer along a sidewall of said gate structure over the semiconductor substrate; creating a recess extending into the semiconductor substrate, adjacent the gate structure; and forming an asymmetric, epitaxial interface coating over a recess surface of the recess via a cyclic deposition/etch (CDE) process. The CDE process includes a first cycle and a subsequent cycle. The first cycle can include depositing a first epitaxial layer having a first composition on the recess surface. The subsequent cycle can include depositing a subsequent epitaxial layer having a subsequent composition over the first epitaxial layer. The dopant concentration of the subsequent composition can be greater than a dopant concentration of the first composition, and a carbon concentration of the first composition can range from 0 to 1.4 at.-%.

In other embodiments, a method for forming a semiconductor substructure, is provided. The method can include: providing a silicon semiconductor substrate; forming a gate structure with a spacer along a sidewall of the gate structure over the semiconductor substrate; creating a recess extending into the semiconductor substrate, adjacent the gate structure; and forming an asymmetric, epitaxial interface coating over a recess surface of the recess via a cyclic deposition/etch (CDE) process. The CDE process can include a first cycle, a second cycle and a subsequent cycle. The first cycle can include depositing a first epitaxial layer having a first composition on said recess surface, and the additional cycles can include depositing at least one intermediate epitaxial layer having intermediate composition(s) on the first epitaxial layer. The subsequent cycle can include depositing a subsequent epitaxial layer having a subsequent composition over the first epitaxial layer. The carbon concentration of the first and second compositions can range from 0 to 1.4 at.-%, while a carbon concentration of the subsequent composition can be at least 1.5 at.-%

In some embodiments, more than one intermediate layer can be deposited. In such embodiments, the dopant-gas flow rate can be modified during each cycle to produce intermediate epitaxial layer(s) 36$_n$ that have a dopant concentration equal to or greater than the previous intermediate epitaxial layer 36$_{n-1}$ and each intermediate layer 36$_n$ can have a dopant concentration that is less than a dopant concentration of the subsequent epitaxial layer 28. For instance, the carbon concentration of the low-dopant layer 26 can be 0 at-%, the first intermediate epitaxial layer 36$_1$ can have a carbon concentration of 0.2 at-% and subsequent intermediate epitaxial layers 36$_2$, 36$_3$, 36$_4$, 36$_5$, 36$_6$ can have carbon concentrations of 0.4 at-%, 0.6 at-%, 0.8 at-%, 1.0 at-% and 1.2 at-%, respectively. In another example, the carbon concentration of the first epitaxial layer 26 can be 0 at-% and intermediate epitaxial layers (36$_1$, 36$_2$, 36$_3$, 36$_4$, 36$_5$, 36$_6$, 36$_7$) can have increasing carbon concentrations (0 at-%, 0 at-%, 0.5 at-%, 0.5 at-%, 1 at-%, 1 at-%, 1.4 at-%, respectively). In such embodiments, the intermediate depositing 208 and etching steps 210 can be repeated once for each intermediate epitaxial layer.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor substructure comprising:
a substrate, having an upper substrate surface;
a gate structure formed over said substrate;
a spacer formed along a sidewall of said gate structure, wherein the spacer comprises a lowest spacer surface that is level with the upper substrate surface;
a seal layer contacting the gate structure and the spacer; and
a source/drain structure disposed in a recess comprising at least a tip profile that laterally extends beyond a vertical projection of the spacer and under said gate structure with a portion of the substrate disposed between the gate structure and the tip profile, said source/drain structure disposed over a recess surface,
wherein said source/drain structure comprises:
a first epitaxial layer, arranged substantially over a lower portion of the recess surface below the tip profile, having a first composition essentially free of carbon, and
a subsequent epitaxial layer, having a subsequent composition, over said first epitaxial layer, wherein a concentration of a dopant in said subsequent composition is greater than a concentration of said dopant in said first composition, wherein said dopant is carbon, phosphorus, or a combination of carbon and phosphorus, and wherein the first epitaxial layer and the subsequent epitaxial layer laterally extend under said gate structure; and
a bulk strain material over the subsequent epitaxial layer, wherein the bulk strain material comprises an upper bulk strain material surface that is level with the upper substrate surface to laterally extend along and contact the lowest spacer surface, wherein the bulk strain material laterally extends beyond the lowest spacer surface at a different gradient than the upper bulk strain material surface to separate the bulk strain material from the seal layer and the gate structure by the substrate.

2. The semiconductor substructure as in claim 1, wherein a thickness of said first epitaxial layer is 20 Å or less.

3. The semiconductor substructure as in claim 1, wherein said first epitaxial layer has a thickness of about 8-20 Å.

4. The semiconductor substructure as in claim 1, wherein a carbon concentration of said subsequent composition is at least 1.5 at.-%.

5. A semiconductor substructure comprising,
a substrate, having an upper substrate surface;
a gate structure formed over said substrate;
a spacer formed along a sidewall of said gate structure, wherein the spacer comprises a lowest spacer surface that is level with the upper substrate surface;
a seal layer contacting the gate structure and the spacer; and
a source/drain structure disposed in a recess comprising at least a tip profile that laterally extends beyond a vertical projection of the spacer and under said gate structure with a portion of the substrate disposed between the gate structure and the tip profile, said source/drain structure disposed over a recess surface,
said source/drain structure comprising:
a first epitaxial layer, arranged substantially over a lower portion of the recess surface below the tip profile, having a first composition essentially free of carbon;
a subsequent epitaxial layer, having a subsequent composition, over said first epitaxial layer, wherein a concentration of a dopant in said subsequent composition is greater than a concentration of said dopant in said first composition;
wherein said source/drain structure further comprises at least one intermediate epitaxial layer between said subsequent epitaxial layer and said first epitaxial layer, wherein a concentration of said dopant in said at least one intermediate epitaxial layer is less than said concentration of said dopant in said subsequent epitaxial layer and greater than or equal to said concentration of said dopant in said first epitaxial layer, and wherein said dopant is carbon or a combination of carbon and phosphorous, wherein the first epitaxial layer and the subsequent epitaxial layer laterally extend under said gate structure; and
a bulk strain material over the subsequent epitaxial layer, wherein the bulk strain material comprises an upper bulk strain material surface that is level with the upper substrate surface to laterally extend along and contact the lowest spacer surface, wherein the bulk strain material laterally extends beyond the lowest spacer surface at a different gradient than the upper bulk strain material surface to separate the bulk strain material from the seal layer and the gate structure by the substrate.

6. The semiconductor substructure as in claim 5, wherein a carbon concentration of said at least one intermediate epitaxial layer ranges from 0 to 1.4 at.-%.

7. The semiconductor substructure as in claim 5, wherein a thickness of said at least one intermediate epitaxial layer is 15 Å or less.

8. The semiconductor substructure as in claim 1, wherein the first epitaxial layer consists essentially of silicon.

9. The semiconductor substructure as in claim 1, wherein the seal layer is formed between the gate structure and the spacer.

10. A semiconductor substructure comprising:

a substrate, having an upper substrate surface;

a gate structure formed over the substrate with a spacer formed along a sidewall of the gate structure, wherein the spacer comprises a lowest spacer surface that is level with the upper substrate surface;

a seal layer contacting the gate structure and the spacer; and source/drain structures each disposed in a recess comprising at least a tip profile that laterally extends beyond a vertical projection of the spacer and under the gate structure with a portion of the substrate disposed between the gate structure and the tip profile, the source/drain structures disposed over a recess surface, wherein each of the source/drain structures comprises:

a first epitaxial layer, arranged substantially over a lower portion of the recess surface below the tip profile, having a first composition essentially free of carbon, and a subsequent epitaxial layer, having a subsequent composition, over the first epitaxial layer, wherein a concentration of a dopant in the subsequent composition is greater than a concentration of the dopant in the first composition, wherein the dopant is carbon, phosphorus, or a combination of carbon and phosphorus, wherein the first epitaxial layer and the subsequent epitaxial layer laterally extend under the gate structure, and a bulk strain material over the subsequent epitaxial layer, wherein the bulk strain material comprises an upper bulk strain material surface that is level with the upper substrate surface to laterally extend along and contact the lowest spacer surface, wherein the bulk strain material laterally extends beyond the lowest spacer surface at a different gradient than the upper bulk strain material surface to separate the bulk strain material from the seal layer and the gate structure by the substrate.

11. The semiconductor substructure of claim 10, wherein a thickness of the first epitaxial layer is 20 Å or less.

12. The semiconductor substructure of claim 10, wherein the first epitaxial layer has a thickness of about 8-20 Å.

13. The semiconductor substructure of claim 10, wherein a carbon concentration of the subsequent composition is at least 1.5 at.-%.

14. The semiconductor substructure of claim 10, wherein the source/drain structure further comprises at least one intermediate epitaxial layer between said subsequent epitaxial layer and said first epitaxial layer, wherein a concentration of said dopant in said at least one intermediate epitaxial layer is less than said concentration of said dopant in said subsequent epitaxial layer and greater than or equal to said concentration of said dopant in said first epitaxial layer, and wherein said dopant is carbon or a combination of carbon and phosphorous.

* * * * *